(12) United States Patent
Choi et al.

(10) Patent No.: US 9,154,044 B2
(45) Date of Patent: Oct. 6, 2015

(54) APPARATUS FOR ESTIMATING CAPACITANCE OF DC-LINK CAPACITOR IN INVERTER

(71) Applicant: LSIS CO., LTD., Anyang-si, Gyeonggi-do (KR)

(72) Inventors: Seung Cheol Choi, Anyang-si (KR); Anno Yoo, Seoul (KR)

(73) Assignee: LSIS Co., Ltd., Anyang-Si, Gyeonggi-Do (KR)

( * ) Notice: Subject to any disclaimer, the term of this patent is extended or adjusted under 35 U.S.C. 154(b) by 250 days.

(21) Appl. No.: 14/038,040

(22) Filed: Sep. 26, 2013

(65) Prior Publication Data

US 2014/0119067 A1 May 1, 2014

(30) Foreign Application Priority Data

Oct. 29, 2012 (KR) .................. 10-2012-0120603

(51) Int. Cl.
  *H02M 5/458* (2006.01)
  *G01R 31/02* (2006.01)
  *H02M 7/49* (2007.01)
  *G01R 31/42* (2006.01)
  *H02M 1/00* (2007.01)

(52) U.S. Cl.
  CPC ............. *H02M 5/458* (2013.01); *G01R 31/028* (2013.01); *H02M 7/49* (2013.01); *G01R 31/42* (2013.01); *H02M 2001/0009* (2013.01)

(58) Field of Classification Search
  CPC ........................................... H02M 5/458
  USPC .............. 363/34–37, 40–41, 65, 71, 72
  See application file for complete search history.

(56) References Cited

U.S. PATENT DOCUMENTS

| | | | |
|---|---|---|---|
| 8,159,840 B2 * | 4/2012 | Yun ................................. | 363/39 |
| 8,187,761 B2 * | 5/2012 | Gu et al. ....................... | 429/432 |
| 8,213,198 B2 * | 7/2012 | Abolhassani et al. .......... | 363/65 |
| 8,629,637 B2 * | 1/2014 | Blasko et al. .................. | 318/376 |
| 8,803,565 B2 * | 8/2014 | Kim et al. ....................... | 327/112 |

FOREIGN PATENT DOCUMENTS

JP  2010-160001  7/2010

OTHER PUBLICATIONS

Japan Patent Office Application Serial No. 2013-213632, Office Action dated Aug. 26, 2014, 2 pages.

* cited by examiner

*Primary Examiner* — Timothy J Dole
*Assistant Examiner* — Htet Kyaw
(74) *Attorney, Agent, or Firm* — Lee, Hong, Degerman, Kang & Waimey

(57) ABSTRACT

An apparatus for estimating capacitance of a DC link capacitor in an inverter is provided. The apparatus for estimating capacitance of a DC link capacitor selects a unit power cell in which capacitance of a DC link capacitor is to be estimated, from unit power cells, and estimates capacitance of the DC link capacitor by correcting a reference voltage that controls a plurality of unit power cells.

7 Claims, 8 Drawing Sheets

APPARATUS FOR ESTIMATING CAPACITANCE OF DC-LINK CAPACITOR IN INVERTER

CROSS-REFERENCE TO RELATED APPLICATION

Pursuant to 35 U.S.C. §119(a), this application claims the benefit of earlier filing date and right of priority to Korean Application No. 10-2012-0120603, filed on Oct. 29, 2012, the contents of which is incorporated by reference herein in its entirety.

BACKGROUND OF THE INVENTION

1. Field of the Invention

The present disclosure relates to an apparatus for estimating capacitance of a DC-link capacitor in an inverter.

2. Background of the Invention

A multi-level medium-voltage inverter is an inverter in which an effective value of an input line voltage is 600V or higher. The multi-level medium-voltage inverter outputs an output phase voltage having multiple stages (or multiple levels). A medium-voltage inverter is used to drive a motor having large capacity ranging from hundreds of kW to tens of MW, and mainly used in the fields such as fans, pumps, compressors, traction, hoist, conveyor, and the like.

Among multi-level medium-voltage inverters, a serial-type H-bridge inverter having a modular structure is easily extendable, so it is commonly used as a medium-voltage inverter. The serial type H-bridge inverter includes a DC link capacitor having large capacitance in every unit power cell, and here, the DC link capacitor, among constituent components of a power conversion circuit, is relatively easily broken.

FIG. 1 is a view illustrating a related art serial-type H-bridge medium voltage inverter.

As illustrated in FIG. 1, the related art medium voltage inverter 100 receives a voltage having a line voltage effective value equal to or higher than 600V from an input power source 200, converts it into a 3-phase voltage, and outputs the same to a motor 300. The motor 300 is a 3-phase motor having a medium voltage.

The medium voltage inverter 100 includes a phase replacement transformer 110 and a plurality of unit power cells 120a to 120f.

The phase replacement transformer 110 electrically insulates the input power source and the medium voltage inverter 100, reduces harmonics from an input terminal, and provides input 3-phase power to the respective unit power cells 120a to 120f.

Upon receiving power from the phase replacement transformer 110, the unit power cells 120a to 120f outputs a phase voltage of the motor 300. The respective unit power cells are divided into three groups. In FIG. 1, a power cell A1 120a and a power cell A2 120b are connected in series to synthesize an a-phase voltage of the motor 300. A power cell B1 120c and a power cell B2 120d are electrically connected to synthesize a b-phase voltage. A power cell C1 120e and a power cell C2 120f are electrically connected to synthesize a c-phase voltage. The synthesized b-phase voltage and a-phase voltage has a phase difference of 120 degrees, and the c-phase voltage and the b-phase voltage also have a phase difference of 120 degrees.

FIG. 2 is a view illustrating a detailed configuration of a unit power cell of FIG. 1.

As illustrated in FIG. 2, a unit power cell 120 of a general medium voltage inverter includes a rectifying unit 121, a DC link capacitor 122, an inverter unit 123, a voltage sensor 124, a current sensor 125, a driving unit 126, and a controller 127.

The rectifying unit 121 receives an electrically insulated AC voltage from the phase replacement transformer 110 and converts it into a DC voltage. The rectifying unit 121 generally includes a plurality of diodes, and the rectified voltage is determined by a difference between input power and output power of the rectifying unit 121 and capacitance of the DC link capacitor 122.

The DC link capacitor 122 compensates for a power difference between the rectifying unit 121 and the inverter unit 123, and the voltage sensor 124 measures a voltage from the DC link capacitor 122.

The inverter unit 123 is a single phase full bridge inverter and synthesizes output from a DC link voltage to the motor 300 through a power switch.

The current sensor 125 measures an output current from the inverter unit 123.

The driving unit 126 independently transmits a driving signal to each unit power cell. The driving unit 126 receives a voltage reference from the controller 127, generates a gating signal for determining a switching state of the inverter unit 123, and provides a state of a unit power cell to the controller 127.

The controller 127 applies a voltage reference $V_{ref}$ to each unit power cell 120 and determines a sequence of an overall system. The controller 127 may determine a voltage reference applied to each unit power cell 120 according to a user command and setting.

According to the voltage reference from the controller 127, the driving unit 126 may determine a gating signal with respect to the voltage reference in consideration of the DC link voltage $V_{dc}$. Also, when the driving unit 126 determines that the DC link capacitor has an error according to the output current $I_{out}$ and the DC link voltage $V_{dc}$, the driving unit 126 may stop generating of the gating signal.

The DC link capacitor used to smooth the DC link voltage has a short lifespan and high fault generation frequency, relative to the other elements, significantly affecting reliability of the inverter. In order to recognize a fault state of the DC link capacitor 122, conventionally, an additional device is required, and also, although an additional device used, it is used merely in a particular operational state such as a power separation state, making it impossible to measure a state thereof in real time.

SUMMARY OF THE INVENTION

Therefore, an aspect of the detailed description is to provide an apparatus for estimating capacitance of a DC-link capacitor in an inverter, in which a voltage reference generating AC power is separated from a voltage reference of a unit power cell of a serial-type H-bridge medium voltage inverter, an output voltage command of each unit power cell is differentiated, and capacitance of a capacitor is estimated by using a formula regarding power of the capacitor.

To achieve these and other advantages and in accordance with the purpose of this specification, as embodied and broadly described herein, an apparatus for estimating capacitance of a DC link capacitor of a unit power cell in a medium-voltage inverter in which a plurality of unit power cells connected in series output a single phase voltage to a motor, includes: a controller configured to generate a voltage reference (a first voltage reference) with respect to the plurality of unit power cells, and generate a select signal for selecting a unit power cell (a first unit power cell) to be used for estimating capacitance of a DC link capacitor from among the plurality of unit power cells; and a driving unit configured to correct the voltage reference by using a load current angle according to the select signal, estimate capacitance of the DC link capacitor of the first unit power cell, generate a gating signal for generating a corrected voltage reference (a second voltage reference) in consideration of the DC link voltage, and provide the generated gate signal to each unit power cell (a second unit power cell) other than the first unit power cell among the plurality of unit power cells.

In an embodiment of the present invention, the driving unit may include: a first generating unit configured to generate first and second trigonometric functions corresponding to an angle of an output current from the load current; a correcting unit configured to correct the first voltage reference to generate a voltage reference (a third voltage reference) for capacitance estimation and the second voltage reference to be provided to each second power unit cell; and an estimating unit configured to estimate capacitance of the DC link capacitor of the first unit power cell by using the third voltage reference.

In an embodiment of the present invention, the driving unit may further include: a second generating unit configured to generate a gating signal for generating the second voltage reference and provide the generated gating signal to each second unit power cell.

In an embodiment of the present invention, the first generating unit may include: a first delay unit configured to delay a phase of a load current as a cosine signal to generate a sinusoidal signal; a third generating unit configured to obtain a magnitude of the load current; and a normalizing unit configured to normalize the cosine signal and the sinusoidal signal with the magnitude of the load current to generate first and second trigonometric functions.

In an embodiment of the present invention, the correcting unit may include: a fourth generating unit configured to multiply the first voltage reference to the number (N) of the plurality of unit power cells to generate a voltage reference (a fourth voltage reference) with respect to a single phase; and a fifth generating unit configured to generate the third voltage reference having a phase difference of ¼ period from that of the load current, from the fourth voltage reference.

In an embodiment of the present invention, the correcting unit may further include a sixth generating unit configured to divide a voltage obtained by subtracting the third voltage reference from the fourth voltage reference by a number (N−1) obtained by subtracting 1 from the number of a plurality of unit power cells to generate the second voltage reference.

In an embodiment of the present invention, the estimating unit may include: a first calculating unit configured to calculate power on the basis of the third voltage reference and the magnitude of the load current; a second calculating unit configured to calculate a variation of DC link voltages; a third calculating unit configured to calculate an average of the DC link voltages; and a capacitance estimating unit configured to estimate capacitance of the DC link capacitor on the basis of the power, the variation, and the average.

According to embodiments of the present invention, an output voltage of a unit power cell intended to be estimated is reconfigured to include only pulsation power, and capacitance of DC link capacitor can be estimated by using capacitor power which does not consider input power of the unit power cell. Also, capacitance of a DC link capacitor in a unit cell can be periodically estimated even in operation to determine a state of the DC link capacitor without using any additional equipment and device, whereby stability and reliability of the medium-voltage inverter can be enhanced.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE INVENTION

The present invention may be embodied in many different forms and may have various embodiments, of which particular ones will be illustrated in drawings and will be described in detail. However, it should be understood that the following exemplifying description of the invention is not meant to restrict the invention to specific forms of the present invention but rather the present invention is meant to cover all modifications, similarities and alternatives which are included in the spirit and scope of the present invention.

Hereinafter, embodiments of the present invention will be described in detail with reference to the accompanying drawings.

Figure 3:
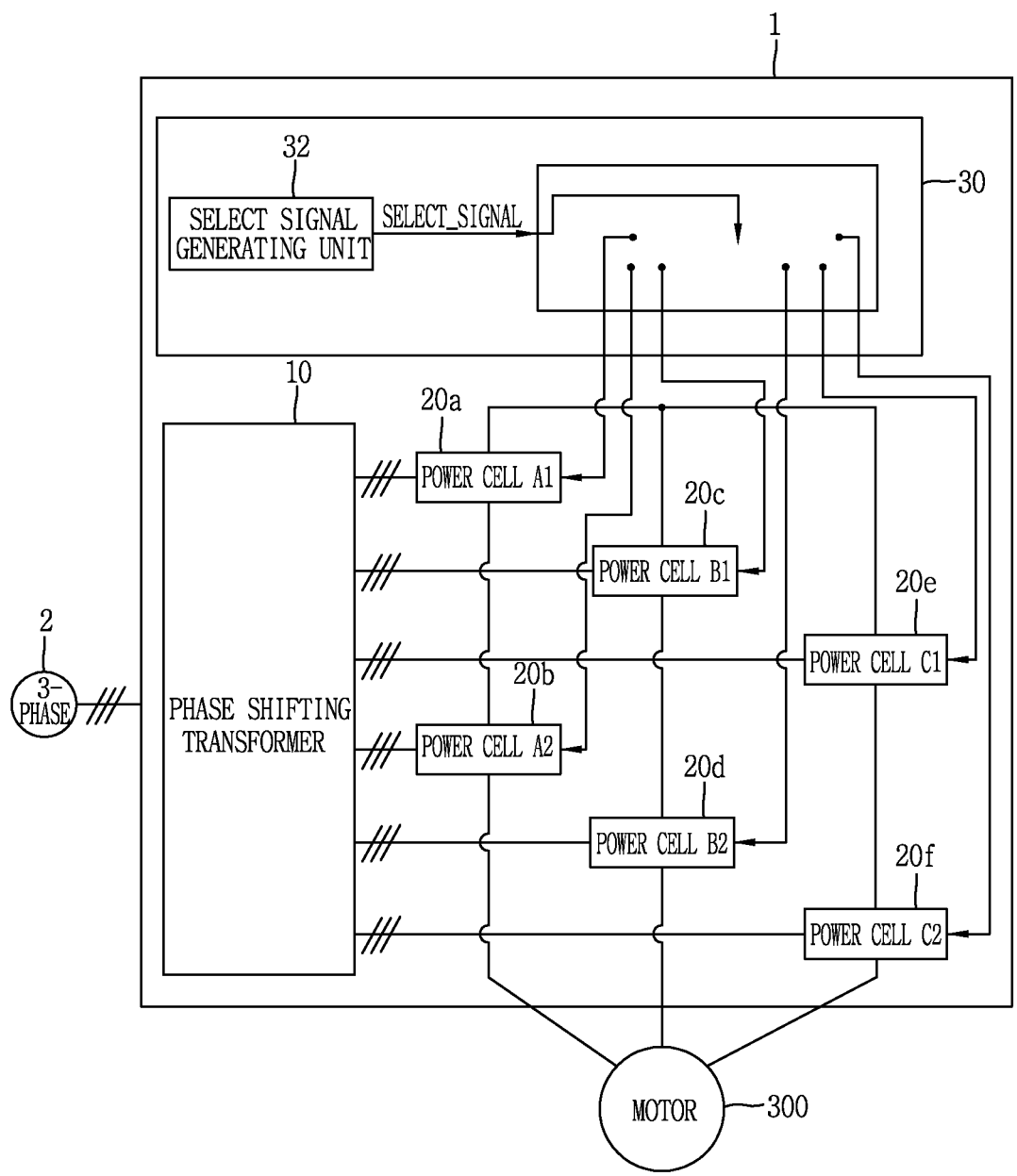
FIG. 3 is a view illustrating a schematic operation of a medium voltage inverter system according to an embodiment of the present invention.

FIG. 3 is a view illustrating a schematic operation of a medium voltage inverter system according to an embodiment of the present invention, in which two-stage unit power cells are configured. However, the amount of unit power cells is illustrated for the description purpose and it would be obvious to a person skilled in the art to which the present invention pertains that the amount of unit power cells is modified as necessary.

As illustrated, the medium-voltage inverter 1 in the medium voltage inverter system according to an embodiment of the present invention may receive a voltage having a line voltage effective value equal to or higher than 600V from an input power source 2, converts it into a 3-phase voltage, and outputs the same to a motor 300. The motor 300 is a 3-phase motor having a medium voltage. For example, the motor 300 may be an induction machine or a synchronous machine.

The medium voltage inverter 1 includes a controller 30. The controller 30 includes a select signal generating unit 32. Any one of power cells having each phase is selected according to a select signal determined by the select signal generating unit 32. Unlike other cells having a corresponding phase, in the selected power cell, capacitance is estimated by using a voltage reference corrected for estimating capacitance of the capacitor.

Namely, a single power cell per phase is selected by the select signal generating unit 32 of the controller 30 according to an embodiment of the present invention, and the selected power cell is used to estimate capacitance according to an embodiment of the present invention, and the other cells perform a general inverter operation.

Figure 4:
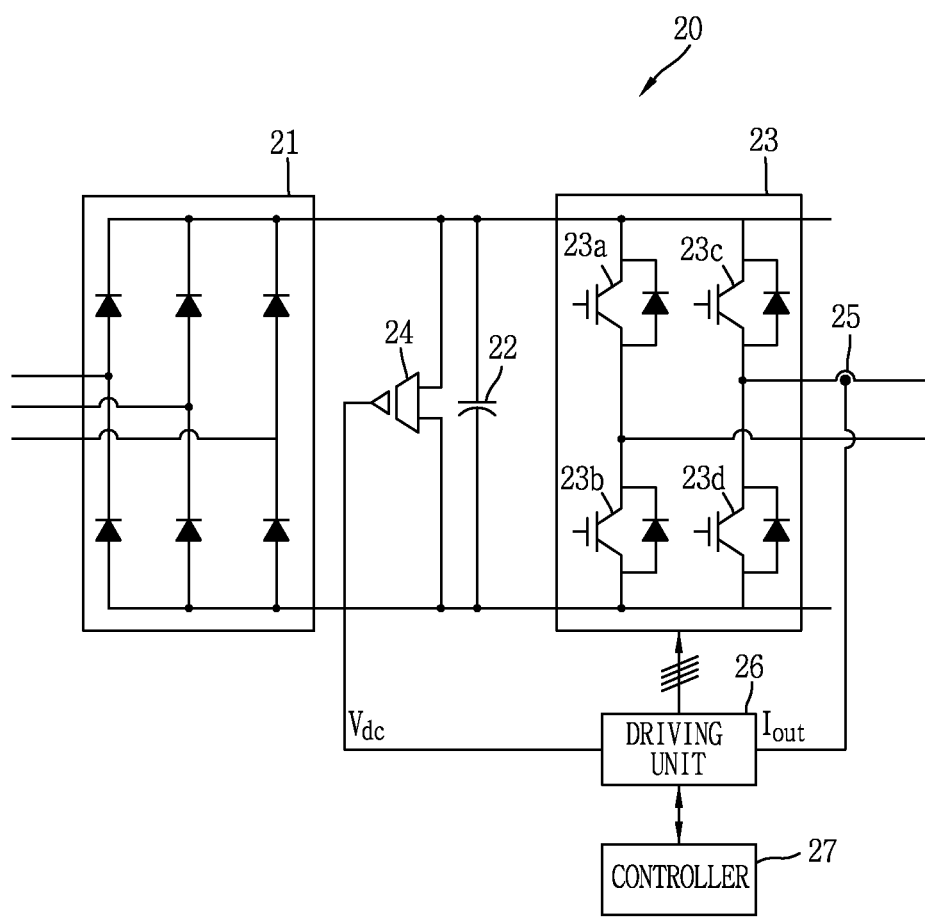
FIG. 4 is a view illustrating a detailed configuration of a unit power cell in FIG. 3.
Figure 5:
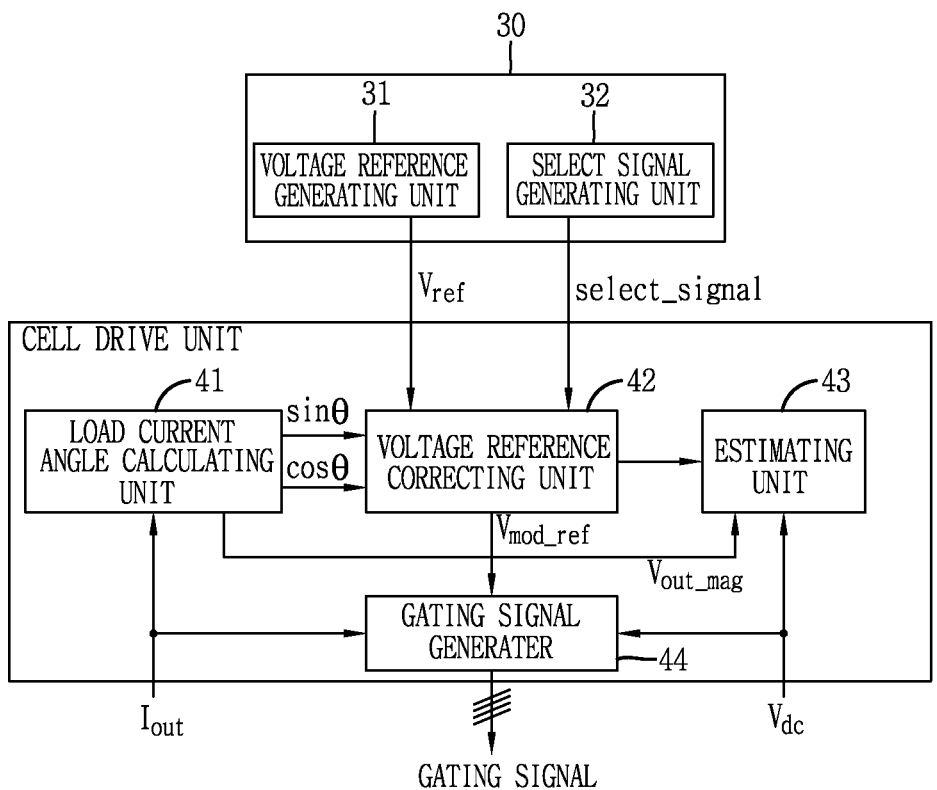
FIG. 5 is a view illustrating a detailed configuration of a controller and a driving unit in FIG. 4.

FIG. 4 is a view illustrating a detailed configuration of a unit power cell in FIG. 3, and FIG. 5 is a view illustrating a detailed configuration of a controller and a driving unit in FIG. 4. A plurality of unit power cells 20a to 20f have the same configuration, so they will be integrally described.

Figure 1:
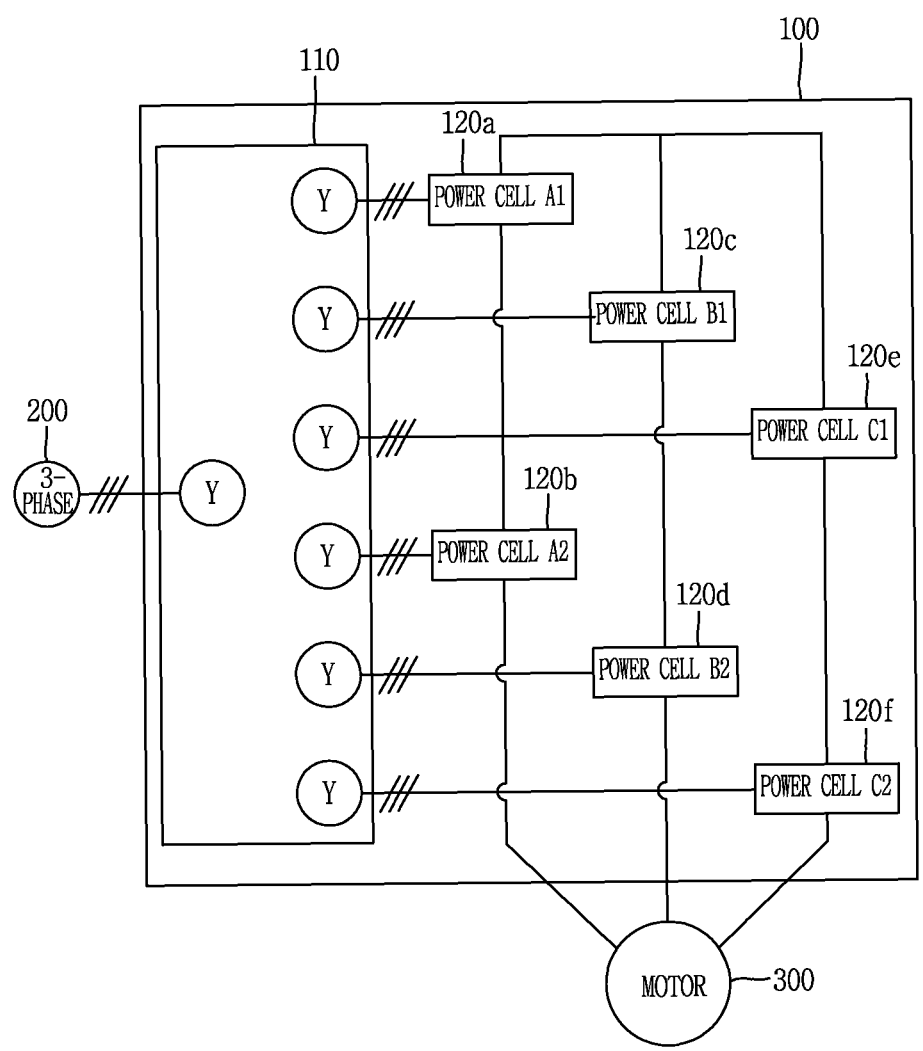
FIG. 1 is a view illustrating a related art serial type H-bridge medium voltage inverter.
Figure 2:
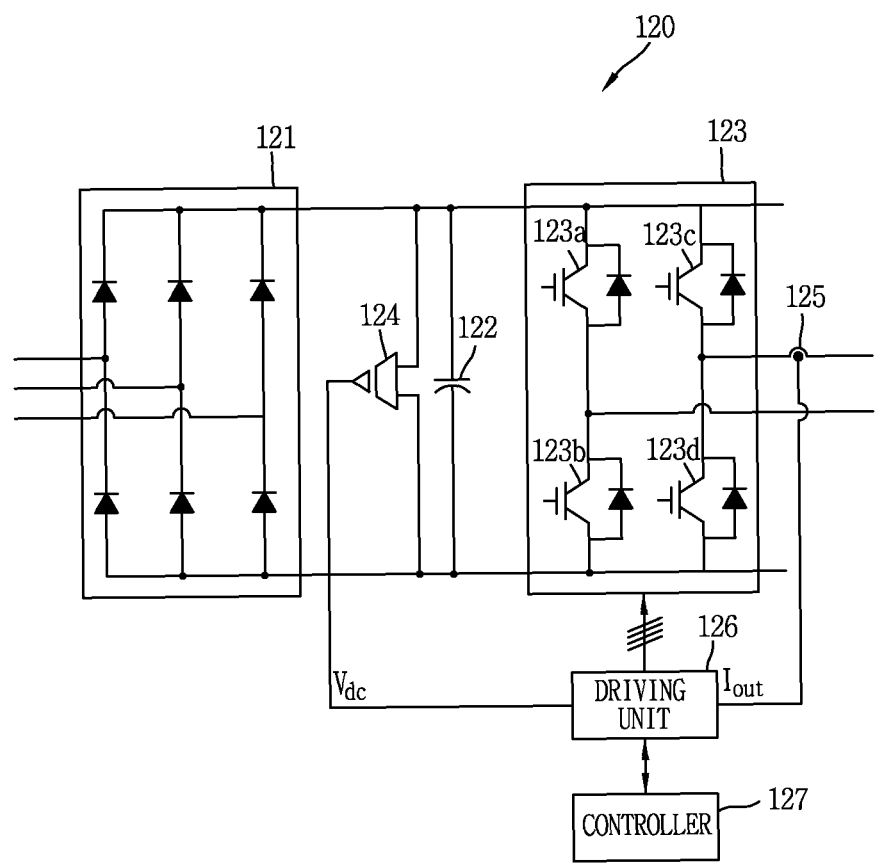
FIG. 2 is a view illustrating a detailed configuration of a unit power cell in FIG. 1.

As illustrated in FIGS. 4 and 5, a unit power cell 20 according to an embodiment of the present invention includes a rectifying unit 21, a DC link capacitor 22, an inverter unit 23, a voltage sensor 24, a current sensor 25, a driving unit 40, and a controller 30. Operations of the rectifying unit 21, the DC link capacitor 22, the inverter unit 23, the voltage sensor 24, and the current sensor 25 are the same as those described above with reference to FIG. 2, so a detailed description thereof will be omitted.

As illustrated in FIG. 5, the controller 30 in FIG. 4 includes a voltage reference generating unit 31 and a select signal generating unit 32. The driving unit 40 includes a load current angle calculating unit 41, a voltage reference correcting unit 42, an estimating unit 43, and a gating signal generating unit 44. The case in which the driving unit 40 and the controller 30 are provided as separate components will be described, but obviously, the driving nit 40 and the controller 30 may be incorporated in to a single component so as to be provided.

The controller 30 according to an embodiment of the present invention applies a voltage reference $V_{ref}$ to each unit power cell, and generates a signal (select signal) for selecting a unit power cell including the DC link capacitor 22 whose capacitance is to be estimated. Also, the controller 30 administers (or controls) a management and operation of the overall system.

In detail, the voltage reference generating unit 31 determines a voltage reference to be provided to each unit cell according to a user command and setting.

The select signal determining unit 32 selects a unit power cell including a DC link capacitor whose capacitance is to be estimated, among the plurality of unit power cells 20, and generates a select signal. The select signal may be applied to the voltage reference correcting unit 42 of the driving unit 40 to select a voltage reference generated by the voltage reference correcting unit 42. This will be described later.

Namely, the controller 30 generates a voltage reference and applies the generated voltage reference to the driving unit 40, like the related art controller 127, and in addition, the controller 30 generates a select signal to select a unit power cell including a DC link capacitor whose capacitance is to be estimated. A single unit power cell per phase may undergo capacitance estimation, and each unit power cell is independently selectable in each phase.

The driving unit 40 generates a gating signal independently for each of the plurality of unit power cells 20. The driving unit 40 generates a gating signal based on a reference from the controller 30, and thus, the inverter unit 23 synthesizes an output voltage.

The load current angle calculating unit 41 receives load current information $I_{out}$ from the current sensor 25, and generates a trigonometric function (sin θ, cos θ) corresponding to an angle of the output current.

The voltage reference correcting unit 42 corrects a voltage reference applied from the controller 30 by using a load current angle. Also, the voltage reference correcting unit 42 determines a voltage reference according to a select signal.

The estimating unit 43 estimates capacitance ($C_{estimation}$) of the DC link capacitor by using a magnitude ($V_{qe\_ref\_mag}$) of an output voltage reference received from the voltage reference correcting unit 42, a magnitude ($I_{out\_mag}$) of a current received from the load current angle calculating unit 41, and a DC link voltage ($V_{dc}$).

The gating signal generating unit 44 determines a gating signal for generating a voltage reference in consideration of the DC link voltage, and provides the determined gating signal to the plurality of unit power cells 20. Also, when the capacitor is determined to have an error (or a fault) based on an output current and a DC link voltage, the gating signal generating unit 44 stops generating of the gating signal.

Hereinafter, an operation of the apparatus for estimating capacitance in the medium voltage inverter system will be described.

Figure 6:
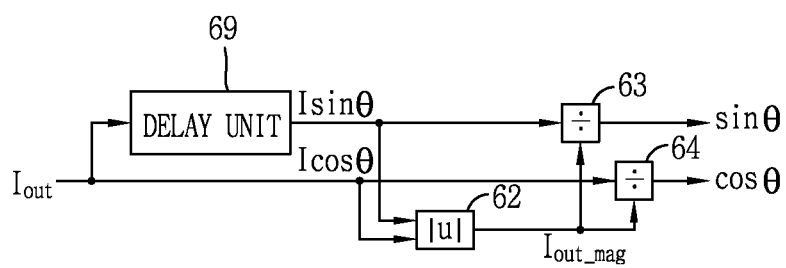
FIG. 6 is a view illustrating a detailed configuration of a load current angle calculating unit in FIG. 5.

FIG. 6 is a view illustrating a detailed configuration of a load current angle calculating unit in FIG. 5.

As illustrated in FIG. 6, the load current angle calculating unit 41 includes a delay unit 61, an absolute value calculating unit 62, and normalizing units 63 and 64.

When a load current has form of a cosine signal (I cos θ), the delay unit 61 may retard a phase of 90 degrees to generate a sinusoidal signal (I sin θ) having 90°-retarded phase. A retarded function of the delay unit 61 may be represented by a transfer function of an all-pass filter (APF) implemented as a quadratic function, as follows.

$$\frac{\text{output}}{\text{input}} = \frac{I\sin\theta}{I_{out}} = \frac{s^2 - \sqrt{2}\,\omega_d s + \omega_d^2}{s^2 + \sqrt{2}\,\omega_d s + \omega_d^2} \qquad \text{[Equation 1]}$$

Here, $$\omega_d = \frac{1+\sqrt{3}}{\sqrt{2}}\omega_N \cong 1.9319\omega_N,$$

$\omega_N$ is a reference angular frequency generating 90-degree phase difference.

The absolute value calculating unit 62 obtains a magnitude ($I_{out\_mag}$) of the load current, and expresses an angle of the load current by trigonometric functions (sin θ, cos θ) through a division operation performed by the normalizing units 63 and 64

Figure 7:
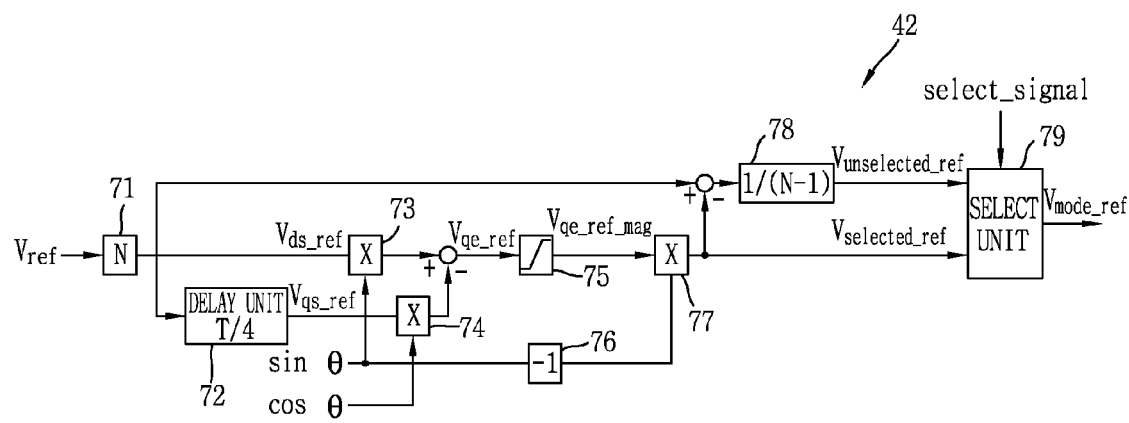
FIG. 7 is a view illustrating a detailed configuration of a voltage reference correcting unit in FIG. 5.

Meanwhile, the voltage reference correcting unit 42 receives the voltage reference ($V_{ref}$) from the controller 30 and reconfigures an output voltage reference of the unit power cell 20 through the trigonometric function calculated by the load current angle calculating unit 41. FIG. 7 is a view illustrating a detailed configuration of the voltage reference correcting unit 42 in FIG. 5.

As illustrated in FIG. 7, the voltage reference correcting unit 42 includes a calculating unit 71, a delay unit 72, multiplying units 73, 74, and 77, a limiting unit 75, calculating units 76 and 78, and a selecting unit 79.

Figure 8:
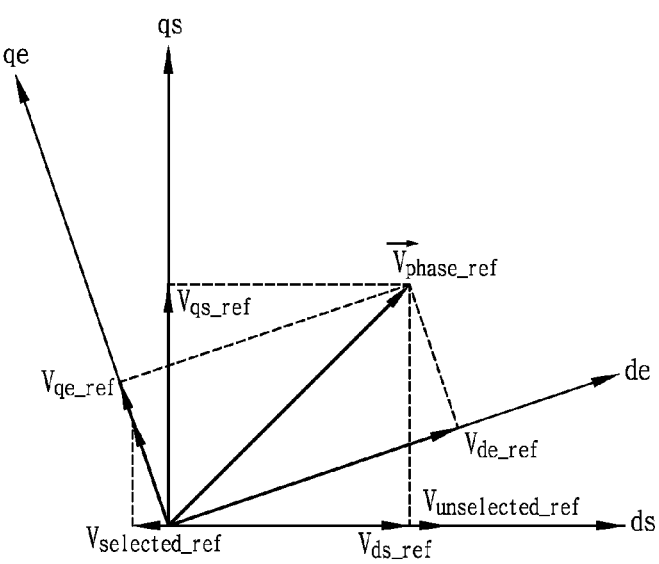
FIG. 8 is a view illustrating an operation of the voltage reference correcting unit in FIG. 7.

The calculating unit 71 multiples the voltage reference ($V_{ref}$) applied from the controller 80 by the number (N) of unit power cells constituting one phase of the medium voltage inverter 1, and calculates a voltage reference ($V_{ds\_ref}$) with respect to one phase of the medium voltage inverter 1. FIG. 8 is a view illustrating an operation of the voltage reference correcting unit in FIG. 7, in which the voltage reference ($V_{ds\_ref}$) calculated by the calculating unit 71 is expressed as a sine wave such as a cosine function on the basis of d-axis of the stationary reference frame of the current angle reference frame. In this case, the voltage reference may be expressed as $V_{ds\_ref}$ in FIG. 8, and the voltage reference having a 90-degree delayed phase may be expressed as $V_{qs\_ref}$ in FIG. 8 by Equation 4.

In this manner, by using the calculated d and q-axis reference voltages of the stationary reference frame of the current angle reference frame and the trigonometric function calculated by the load current angle calculating unit 41, the delay unit 72 and the multiplying units 73 and 74 may calculate q-axis reference voltage $V_{qe\_ref}$ of the synchronous reference frame of the current angle reference frame as expressed by Equation 2. Namely, the delay unit 72 and the multiplying units 73 and 74 may determine the q-axis reference voltage $V_{qe\_ref}$ of the synchronous reference frame of the current angle reference frame.

$$V_{qe\_ref} = -V_{ds\_ref}\sin\theta + V_{qe\_ref}\cos\theta \quad \text{[Equation 2]}$$

In Equation 2, the calculated voltage refers to a magnitude of a voltage generating an AC component of output power of each unit power cell.

The limiting unit 75 limits ($V_{qe\_ref\_mag}$) a magnitude of output voltage as expressed by Equation 2 in consideration of a magnitude of a maximum output voltage of each unit power cell or a magnitude of an allowable DC link ripple voltage. The limited voltage ($V_{qe\_ref\_mag}$) has a relationship of $-\sin\theta(=\cos(\theta+\pi/2))$ when viewed from the d axis of the stationary reference frame, so it has a phase difference of 90 degrees from the load current. Through this relationship, $V_{selected\_ref}$ is determined by the calculating unit 76 and the multiplying unit 77, and the selecting unit 79 may receive a select signal from the controller 30 and determine a unit power cell including a capacitor whose capacitance is to be estimated. Since the output voltage and the current of a unit power cell which has used $V_{selected\_ref}$ has a 90-degree phase difference (¼ period), it can be expressed as follows.

$$v_0(t) = \sqrt{2}V_0 \sin\omega_o t \quad \text{[Equation 3]}$$

$$i_0(t) = \sqrt{2}I_0 \sin(\omega_o t - \pi/2) \quad \text{[Equation 4]}$$

Based on Equation 3 and Equation 4, output power of a unit power cell having a capacitor whose capacitance is to be estimated is determined as follows.

$$p_0(t) = v_0(t)i_0(t) = -V_0 I_0 \cos(2\omega_o t - \pi/2) \quad \text{[Equation 5]}$$

In general, power determined by an AC output voltage and an AC output current includes both a DC component and an AC component. In comparison, according to Equation 5, it can be seen that power used for estimating capacitance according to an embodiment of the present invention has only an AC component.

Meanwhile, unit power cells not selected by the select signal use a voltage reference of $V_{unselected\_ref}$ through the selecting unit 79, and when a difference between a voltage reference of one phase of the medium voltage inverter 1 and the voltage reference ($V_{selected\_ref}$) generating AC power of a unit power cell is obtained by 1/(N−1) times by the calculating unit 78, $V_{unselected\_ref}$ may be determined as expressed by Equation 6 shown below.

$$V_{unselected\_ref} = (V_{phase\_ref} - V_{selected\_ref})/(N-1) \quad \text{[Equation 6]}$$

Thus, since the sum of the reconfigured voltage references ($V_{unselected\_ref}$, $V_{unselected\_ref}$) is a voltage reference ($V_{ds\_ref}$) of each phase, each unit power cell may be operated by the reconfigured voltage reference, without affecting control of the controller 30.

Figure 9:
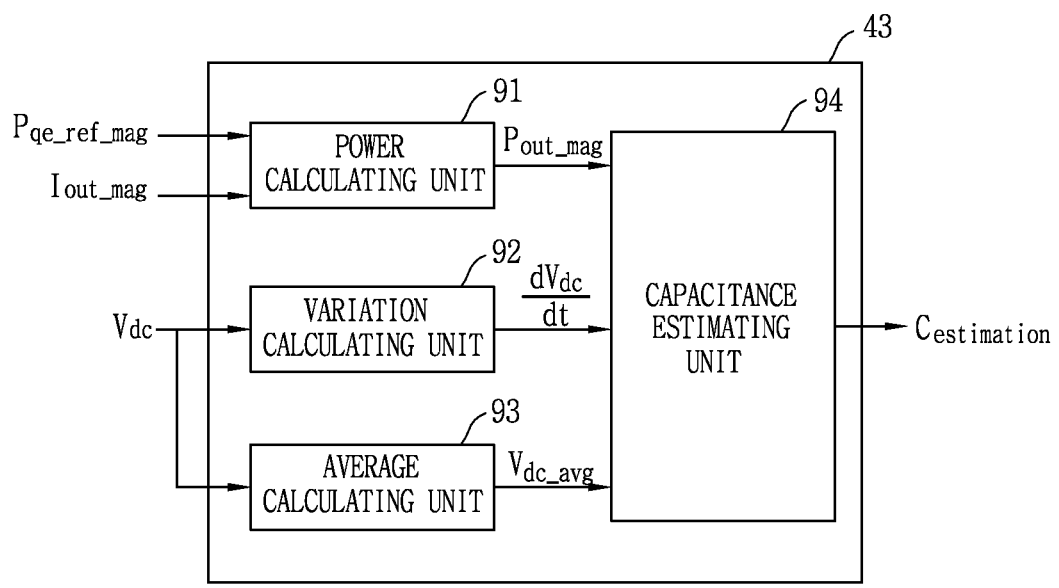
FIG. 9 is a view illustrating a detailed configuration of an estimating unit in FIG. 5.

FIG. 9 is a view illustrating a detailed configuration of the estimating unit in FIG. 5, in which capacitance of a DC link capacitor of a selected unit power cell is estimated.

Capacitance of the DC link capacitor may be calculated through an equation regarding approximated capacitor power like Equation 7 shown below.

$$P_{cap}(t) = P_{in}(t) - P_o(t) = C_{dc} v_{dc0} \frac{dv_{dc}}{dt} \quad \text{[Equation 7]}$$

Here, $P_{in}(t)$ is input power of a unit power cell, $C_{dc}$ is capacitance of the DC link capacitor 22, $v_{dc}$ is a DC link voltage, $V_{dc0}$ indicates an operating point of the DC link voltage, which corresponds to an average of the DC link voltages.

In the present embodiment, since output power of a unit power cell is configured as AC power as shown in Equation 5, the average voltage of the DC link voltage is affected by an input voltage of a unit power cell. When the DC link voltage reaches the average voltage, it is not affected by the input voltage of the unit power cell. Thus, in the normal state in which the DC voltage reaches the average thereof, power of the DC link capacitor 22 is as follows.

$$P_{cap} = -P_o(t) = V_0 I_0 \cos(2\omega_o t - \pi/2) = C_{dc} v_{dc0} \frac{dv_{dc}}{dt} \quad \text{[Equation 8]}$$

In order to calculate capacitance by using Equation 8, power ($P_{cap}$) of the capacitor, the average ($v_{dc0}$) of the DC link voltages, and a variation $$\left(\frac{dv_{dc}}{dt}\right)$$

of the DC link voltages are required. Thus, the estimating unit 43 according to an embodiment of the present invention includes a power calculating unit 91, a variation calculating unit 92, an average calculating unit 93, and a capacitance estimating unit 94.

Figure 10:
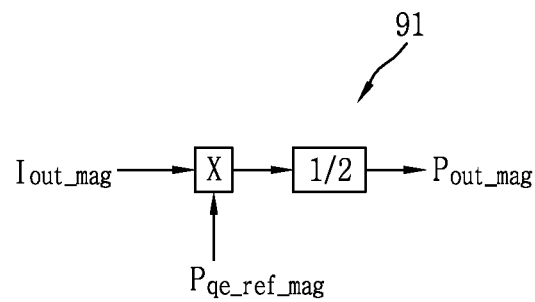
FIG. 10 is a view illustrating a detailed configuration of a power calculating unit in FIG. 9.

FIG. 10 is a view illustrating a detailed configuration of the power calculating unit 91 in FIG. 9.

As illustrated, the power calculating unit 91 receives a magnitude ($I_{out\_mag}$) of a load current from the load current angle calculating unit 41 and a magnitude ($V_{qe\_ref}^{mag}$) of an output voltage of a unit power cell, and outputs output power of the unit power cell 20 as follows.

$$P_{o\_peak} = (V_{o\_peak} I_{o\_peak})/2 \quad \text{[Equation 9]}$$

Here, $V_{0\_peak}$ signifies $V_{qe\_mag}$, $I_{0\_peak}$ signifies $I_{out\_mag}$, and Po_peak signifies $P_{out\_mag}$.

Figure 11:
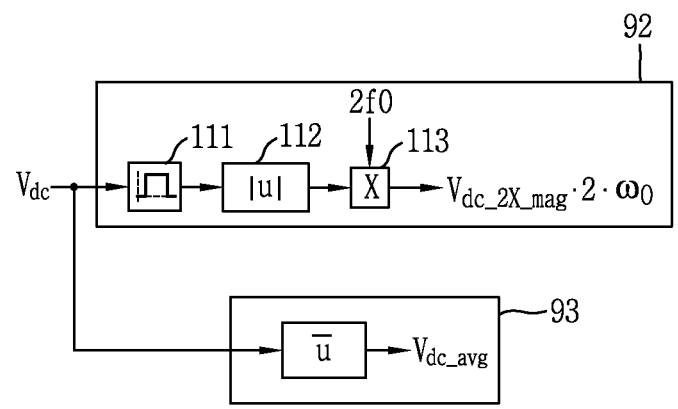
FIG. 11 is a view illustrating a detailed configuration of a variation calculating unit and an average calculating unit in FIG. 9.

FIG. 11 is a view illustrating a detailed configuration of the variation calculating unit 92 and the average calculating unit 93 in FIG. 9. The variation calculating unit 92 and the average calculating unit 93 calculate a variation and an average of DC link voltages. When the DC link voltage ($V_{dc}$) is received from the voltage sensor 24, the DC link voltage includes secondary harmonic of an operating frequency due to the output power of Equation 8, so only a primary harmonic component may be allowed to pass through a band pass filter 111 to obtain a magnitude of the DC link AC component as expressed by Equation 11 by the absolute value calculating unit 112. A DC link average voltage may be obtained through mean operation (or average operation) as expressed by Equation 11.

A transfer function of the band pass filter 111 is as follows.

$$\frac{Output}{Input} = \frac{2\omega_o s}{s^2 + 2\omega_o s + (2\omega_o)^2} \qquad [\text{Equation 10}]$$

A DC link average voltage may be obtained by Equation 11 shown below.

The characteristics of this equation is the same as those of the low pass filter.

$$\frac{Output}{Input} = \frac{\omega}{s + \omega} \qquad [\text{Equation 11}]$$

The absolute value calculating unit 112 may calculate an absolute value by using the following function, and may obtain a magnitude of an AC component through the calculated absolute value. Here, however, a cutoff frequency is set to be lower than the secondary harmonic of the operating frequency.

$$|u| = \sqrt{2x^2}\,\frac{\omega}{s+\omega} \qquad [\text{Equation 12}]$$

The capacitance estimating unit 94 estimates capacitance of the DC link capacitor 22 by developing Equation 13 from the Equation 8.

$$C_{estimation} = P_{out\_mag}/(V_{dc\_2x\_mag} \cdot 2\cdot\omega_o \cdot V_{dc\_avg}) \qquad [\text{Equation 13}]$$

Figure 12:
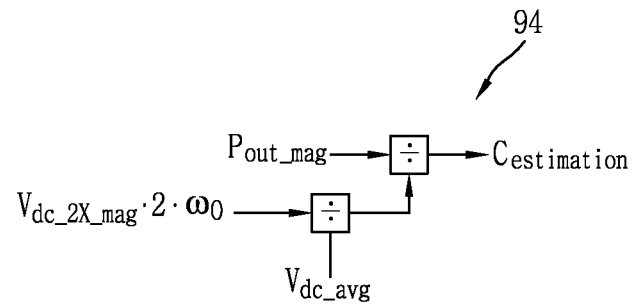
FIG. 12 is a view illustrating a detailed configuration of a capacitance estimating unit of FIG. 9.

FIG. 12 is a view illustrating a detailed configuration of the capacitance estimating unit 94 of FIG. 9.

As illustrated in FIG. 12, capacitance may be estimated from Equation 13 by using the secondary harmonic component ($V_{dc\_2x\_mag}$) of the DC link voltage, as a variation ($dv_{dc}$) of the DC link voltage, and using the average ($V_{dc\_avg}$) as an operating point.

As described above, the apparatus for estimating capacitance according to an embodiment of the present invention can reconfigure an output voltage of a unit power cell intended to be estimated such that it includes only pulsation power, and estimate capacitance of the DC link capacitor by using capacitor power which does not consider (or include) input power of the unit power cell. In addition, capacitance of a DC link capacitor in a unit cell can be periodically estimated even during operation to determine a state of the DC link capacitor without using any additional equipment and device, whereby stability and reliability of the medium-voltage inverter can be enhanced.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. An apparatus for estimating capacitance of a DC link capacitor of a unit power cell in a medium-voltage inverter in which a plurality of unit power cells connected in series output a single phase voltage to a motor, the apparatus comprising:
   a controller configured to generate a first voltage reference with respect to the plurality of unit power cells, and generate a select signal for selecting a first unit power cell to be used for estimating capacitance of a DC link capacitor from among the plurality of unit power cells; and
   a driving unit configured to correct the first voltage reference by using a load current angle according to the select signal, estimate capacitance of the DC link capacitor of the first unit power cell, generate a gating signal for generating a corrected second voltage reference in consideration of the DC link voltage, and provide the generated gate signal to a second unit power cell other than the first unit power cell among the plurality of unit power cells.

2. The apparatus of claim 1, wherein the driving unit comprises:
   a first generating unit configured to generate first and second trigonometric functions corresponding to an angle of an output current from the load current;
   a correcting unit configured to correct the first voltage reference to generate a third voltage reference for capacitance estimation and the second voltage reference to be provided to each second power unit cell; and
   an estimating unit configured to estimate capacitance of the DC link capacitor of the first unit power cell by using the third voltage reference.

3. The apparatus of claim 2, wherein the driving unit further comprises:
   a second generating unit configured to generate a gating signal for generating the second voltage reference and provide the generated gating signal to each second unit power cell.

4. The apparatus of claim 2, wherein the first generating unit comprises:
   a first delay unit configured to delay a phase of a load current as a cosine signal to generate a sinusoidal signal;
   a third generating unit configured to obtain a magnitude of the load current; and a normalizing unit configured to normalize the cosine signal and the sinusoidal signal with the magnitude of the load current to generate first and second trigonometric functions.

5. The apparatus of claim 2, wherein the correcting unit comprises:
- a fourth generating unit configured to multiply the first voltage reference to the number (N) of the plurality of unit power cells to generate a fourth voltage reference with respect to a single phase; and
- a fifth generating unit configured to generate the third voltage reference having a phase difference of ¼ period from that of the load current, from the fourth voltage reference.

6. The apparatus of claim 5, wherein the correcting unit further comprises:
- a sixth generating unit configured to divide a voltage obtained by subtracting the third voltage reference from the fourth voltage reference by a number (N−1) obtained by subtracting 1 from the number of a plurality of unit power cells to generate the second voltage reference.

7. The apparatus of claim 5, wherein the estimating unit comprises:
- a first calculating unit configured to calculate power on the basis of the third voltage reference and the magnitude of the load current;
- a second calculating unit configured to calculate a variation of DC link voltages;
- a third calculating unit configured to calculate an average of the DC link voltages; and
- a capacitance estimating unit configured to estimate capacitance of the DC link capacitor on the basis of the power, the variation, and the average.

* * * * *